United States Patent
Akram et al.

(10) Patent No.: US 6,363,295 B1
(45) Date of Patent: *Mar. 26, 2002

(54) METHOD FOR USING DATA REGARDING MANUFACTURING PROCEDURES INTEGRATED CIRCUITS (IC'S) HAVE UNDERGONE, SUCH AS REPAIRS, TO SELECT PROCEDURES THE IC'S WILL UNDERGO, SUCH AS ADDITIONAL REPAIRS

(75) Inventors: Salman Akram, Boise; Warren M. Farnworth, Nampa; Derek J. Gochnour; David R. Hembree, both of Boise; Michael E. Hess, Kuna; John O. Jacobson, Boise; James M. Wark, Boise; Alan G. Wood, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/292,655

(22) Filed: Apr. 15, 1999

Related U.S. Application Data

(63) Continuation of application No. 08/871,015, filed on Jun. 6, 1997, now Pat. No. 5,907,492.

(51) Int. Cl.[7] ............................................. G06F 19/00
(52) U.S. Cl. ..................... 700/121; 700/116; 702/117
(58) Field of Search ................................ 700/121, 116, 700/117, 115, 105, 108, 109, 110, 112; 702/117, 118; 209/573; 365/200; 438/15, 10

(56) References Cited

U.S. PATENT DOCUMENTS

| | | | |
|---|---|---|---|
| 4,510,673 A | * 4/1985 | Shils et al. | 438/15 |
| 4,958,373 A | 9/1990 | Usami et al. | 382/8 |
| 4,967,381 A | 10/1990 | Lane et al. | 364/551.01 |
| 5,103,166 A | 4/1992 | Jean et al. | 324/158 R |
| 5,105,362 A | 4/1992 | Kotani | 364/468.15 |
| 5,217,834 A | 6/1993 | Higaki | 430/30 |
| 5,219,765 A | 6/1993 | Yoshida et al. | 437/8 |
| 5,226,118 A | 7/1993 | Baker et al. | 395/161 |
| 5,253,208 A | * 10/1993 | Kang | 365/200 |
| 5,271,796 A | 12/1993 | Miyashita et al. | 156/626 |
| 5,289,113 A | 2/1994 | Meaney et al. | 324/73.1 |
| 5,294,812 A | 3/1994 | Hashimoto et al. | 257/65 |
| 5,301,143 A | 4/1994 | Ohri et al. | 365/96 |
| 5,420,796 A | 5/1995 | Weling et al. | 364/468 |
| 5,440,493 A | 8/1995 | Doida | 364/468 |
| 5,442,561 A | 8/1995 | Yoshizawa et al. | 364/468 |
| 5,450,326 A | 9/1995 | Black | 364/468 |
| 5,467,304 A | 11/1995 | Uchida et al. | 365/174 |
| 5,483,175 A | 1/1996 | Ahmad et al. | 324/766 |
| 5,495,417 A | 2/1996 | Fuduka et al. | 364/468 |
| 5,511,005 A | 4/1996 | Abbe et al. | 364/552 |
| 5,568,408 A | 10/1996 | Maeda | 702/117 |
| 5,907,492 A | * 5/1999 | Akram et al. | 700/121 |
| 5,927,512 A | * 7/1999 | Beffa | 209/573 |
| 6,122,563 A | * 9/2000 | Beffa | 700/121 |

FOREIGN PATENT DOCUMENTS

JP  5-74909  3/1993

* cited by examiner

Primary Examiner—William Grant
Assistant Examiner—Steven R. Garland
(74) Attorney, Agent, or Firm—TraskBritt

(57) ABSTRACT

An inventive method in an integrated circuit (IC) manufacturing process for using data regarding repair procedures conducted on IC's at probe to determine whether any further repairs will be conducted later in the manufacturing process includes storing the data in association with a fuse ID of each of the IC's. The ID codes of the IC's are automatically read, for example, at an opens/shorts test during the manufacturing process. The data stored in association with the ID codes of the IC's is then accessed, and additional repair procedures the IC's may undergo are selected in accordance with the accessed data. Thus, for example, the accessed data may indicate that an IC is unrepairable, so the IC can proceed directly to a scrap bin without having to be queried to determine whether it is repairable, as is necessary in traditional IC manufacturing processes.

35 Claims, 6 Drawing Sheets

US 6,363,295 B1

METHOD FOR USING DATA REGARDING MANUFACTURING PROCEDURES INTEGRATED CIRCUITS (IC'S) HAVE UNDERGONE, SUCH AS REPAIRS, TO SELECT PROCEDURES THE IC'S WILL UNDERGO, SUCH AS ADDITIONAL REPAIRS

This application is a continuation of application Ser. No. 08/871,015, filed Jun. 6, 1997, now U.S. Pat. No. 5,907,492, issued May 25, 1999, which is related to: a application having Ser. No. 08/591,238, filed Jan. 17, 1996, entitled "METHOD AND APPARATUS [sic] FOR STORAGE OF TEST RESULTS WITHIN AN INTEGRATED CIRCUIT", abandoned in favor of a continuation-in-part application filed Feb. 27, 1998, having Ser. No. 09/032,417, now U.S. Pat. No. 6,194,738 issued Feb. 27, 2001; a application having Ser. No. 08/664,109, filed Jun. 13, 1996, now U.S. Pat. No. 5,895,962, issued Apr. 20, 1999; a application filed Jan. 17, 1997 having Ser. No. 08/85,353, now U.S. Pat. No. 5,927,512, issued Jul. 27, 1999; a application filed Feb. 17, 1997 having Ser. No. 08/801,565 now U.S. Pat. No. 5,844,803, issued Dec. 1, 1998; a application filed Feb. 6, 1997 having Ser. No. 08/806,442, now U.S. Pat. No. 5,915,231, issued Jun. 22, 1999; and a application filed Mar. 24, 1997 having Ser. No. 08/822,731, now U.S. Pat. No. 5,856,923, issued Jan. 5, 1999.

BACKGROUND OF THE INVENTION

1. Field of the Invention

The present invention relates in general to integrated circuit (IC) manufacturing. More specifically, it relates to methods in IC manufacturing processes for using data regarding manufacturing procedures IC's have undergone, such as repair procedures, to select procedures the IC's will undergo, such as additional repair procedures.

2. State of the Art

As shown in FIG. 1, a typical process 10 for manufacturing very small electronic circuits referred to as "Integrated Circuits" (IC's) begins with the IC's being formed or "fabricated" on the surface of a wafer 12 of semiconductor material, such as silicon. Once fabricated, IC's are electronically probed to determine whether they are functional (i.e., "good") or nonfunctional (i.e., "bad"). If any IC's are found to be bad, an attempt is made to repair those IC's by replacing nonfunctional circuit elements in the IC's with spare circuit elements. For example, Dynamic Random Access Memory (DRAM) IC's are typically repaired by replacing nonfunctional rows or columns of memory cells in the IC's with spare rows or columns.

These repairs are not always successful, because the number of spare circuit elements on an IC may be exhausted before all nonfunctional circuit elements on the IC are replaced, and because some circuit elements on IC's have no spares to replace them. As a result, a number of bad IC's typically remain on a wafer 12 even after attempts are made to repair the IC's. The location of bad IC's on a wafer 12, along with the location of any good IC's on the wafer 12, is typically stored in a computer database commonly referred to as a "wafer map."

After being probed and, if necessary, repaired, IC's begin an assembly process with their wafer 12 being mounted on an adhesive film. In some instances, the film is a special high-adhesion Ultraviolet (U.V.) film. Without cutting the adhesive film, IC's are sawed from their wafer 12 into discrete IC dice or "chips" using high-speed precision dicing equipment. IC dice mounted on U.V. film are then exposed to U.V. light to loosen the grip of the film on the dice. IC dice identified as good by their wafer map are then each "picked" by automated equipment from their sawed wafer 12 and its associated film and "placed" on an epoxy coated bonding site of one lead frame in a strip of interconnected lead frames, while IC dice identified as bad are discarded into a scrap bin 14. The epoxy attaching the good IC dice to their lead frames is then cured, and the attached dice are wire bonded to their lead frames using high speed bonding equipment.

Once wire bonded, IC dice and their associated lead frames are formed into IC packages using a hot thermosetting plastic encapsulant injected into a mold. IC packages are then cured to set their plastic encapsulant. After encapsulation and curing, leads of the lead frames projecting from the packages are dipped in a cleansing chemical bath in a process referred to as "de-flash" and then electroplated with a lead/tin finish. Connections between lead frames in lead frame strips are then cut to "singulate" IC packages into discrete IC devices.

After assembly, discrete IC devices are tested in a simple electronic test referred to as an "opens/shorts" test, which checks for "opens" (i.e., no connection) within the devices where connections should exist and "shorts" (i.e., a connection) where connections should not exist. Devices that pass the opens/shorts test proceed on through the process 10 to various burn-in and test procedures where they are tested for functionality, operability, and reliability, and devices that pass these burn-in and test procedures are then typically shipped to customers.

IC devices that fail any of the opens/shorts, burn-in, and test procedures are checked to determine whether they are repairable. This "check" typically includes an electronic "querying" of a device to determine whether enough spare circuit elements remain in the device to effect necessary repairs. Devices determined to be unrepairable are scrapped in a scrap bin 16, while devices that are repairable are repaired, typically by replacing nonfunctional circuit elements in the devices with spare circuit elements in the same manner as described above. After being repaired, these devices then reenter the manufacturing process 10 just prior to the opens/shorts, burn-in, or test procedures they failed.

Electronic querying of IC devices to determine whether spare circuit elements are available to effect repairs increases the time required to move the devices through the manufacturing process 10 and places an additional burden on expensive testing resources. While the extra time added by querying one IC device may be insignificant, the time required to query thousands and thousands of IC devices adds up and can result in a significant reduction in the number of IC devices completing the manufacturing process 10 in a given amount of time. Therefore, there is a need in the art for a method of determining whether enough spare circuit elements are available in an IC device to effect repairs without having to query the device.

Similarly, as shown in FIG. 2, a typical process 20 for manufacturing so-called "flip-chip" and "Chip-On-Board" (COB) Multi-Chip Modules (MCM's), in which multiple IC dice are typically attached directly to a substrate, such as a printed circuit board (PCB), begins with IC's being fabricated on the surface of a semiconductor wafer 22 in the same manner as described above. Once fabricated, IC's are electronically probed to determine whether they are good or bad, and if any IC's are found to be bad, an attempt is made to repair those IC's (i.e., make them good IC's) by replacing nonfunctional circuit elements in the IC's with spare circuit elements. The locations of good and bad IC's on a wafer 22 are then typically stored in an electronic wafer map.

After being probed and, if necessary, repaired, IC's begin an assembly process with their wafer 22 being mounted on an adhesive film. Without cutting this film, IC's are then sawed from their wafer 22 into discrete IC dice using high-speed precision dicing equipment. IC dice that are mounted on the special high-adhesion U.V. film described above are then exposed to U.V. light to loosen the grip of the film on the dice.

IC dice identified as good by their electronic wafer map are then each picked by automated equipment from their sawed wafer 22 and its associated film, typically for attachment to a substrate in a panel of multiple substrates, such as a panel of interconnected PCB's. If the assembly process is a flip-chip process, picked dice are then flipped and directly attached at their active, frontside surfaces to substrates to form MCM's. If the assembly process is a COB process, picked dice are directly attached at their inactive, backside surfaces to adhesive coated bonding sites of substrates to form MCM's. IC dice identified as bad are discarded into a scrap bin 24.

Panels of MCM's are then cured. If the assembly process is a COB process, the MCM's may be plasma cleaned, if necessary, and the COB IC dice are then wire bonded to their substrates using high speed bonding equipment.

After assembly, panels of MCM's are tested in an opens/shorts test. Panels having COB IC dice that pass the opens/shorts test proceed on through the manufacturing process 20 so the dice can be encapsulated using an overmold, hard cover, or so-called "glob" top, while panels having flip-chip IC dice that pass the opens/shorts test may have their dice encapsulated using an underfill followed by an ovennold, hard cover, or glob top. As will be described in more detail below, alternatively flip-chip IC dice may be encapsulated after burn-in and test procedures. The disposition of panels of MCM's having COB and flip-chip attached IC dice that fail the opens/shorts test will be described in more detail below.

Panels of MCM's having both COB and flip-chip IC dice, including those panels having flip-chip IC dice that were not encapsulated, are then singulated into discrete MCM's, typically by a shear press or router. After singulation, those MCM's having encapsulated IC dice have their dice tested again in an additional opens/shorts test to check for problems caused by the encapsulation. MCM's having encapsulated dice that pass this additional opens/shorts test, as well as MCM's having dice that were not encapsulated, then proceed on in the manufacturing process 20 to various burn-in and test procedures. The disposition of any MCM's having encapsulated dice that fail the additional opens/shorts test will be described in more detail below.

After the burn-in and test procedures, MCM's having unencapsulated flip-chip IC dice that pass the procedures proceed on in the process 20 so their dice may be covered with an overmold, hardcover, or glob top. Dice covered in this manner are then checked in a further opens/shorts test for problems caused by their being covered, and MCM's having dice that pass this further test are then typically shipped to customers. MCM's having encapsulated IC dice that pass the burn-in and test procedures skip this final opens/shorts test and typically proceed to shipping.

MCM's having attached IC dice that fail any of the opens/shorts, burn-in, and test procedures are checked to determine whether their associated IC dice are repairable. This "check" typically includes an electronic querying of the IC dice to determine whether enough spare circuit elements remain in the dice for effecting repairs. MCM's determined to have unrepairable IC dice are then either reworked using replacement IC dice in an expensive and time-consuming procedure or scrapped in a scrap bin 26, while MCM's having IC dice that are repairable are repaired, typically by replacing nonfunctional circuit elements in the IC dice with spare circuit elements. After being repaired, these MCM's then reenter the manufacturing process 20 just prior to the opens/shorts, burn-in, or test procedures they failed.

As discussed above, electronic querying of IC dice to determine whether spare circuit elements are available to effect repairs increases the time required to move MCM's through the manufacturing process 20 and places an additional burden on expensive testing resources. Also, IC dice that require repair, and are found to be unrepairable only after the assembly process, waste assembly time, materials, and resources and necessitate the scrapping or reworking of MCM's that may contain many functional dice. It is desirable, then, to have an IC manufacturing method for identifying unrepairable IC dice so they may be kept out of COB, flip-chip, and other MCM assembly processes.

As described in U.S. Pat. Nos. 5,301,143, 5,294,812, and 5,103,166, some methods have been devised to electronically identify IC dice. Such methods take place "off" the manufacturing line, and involve the use of electrically retrievable identification (ID) codes, such as so-called "fuse ID's," programmed into individual IC dice to identify the dice. The programming of a fuse ID typically involves selectively blowing an arrangement of fuses or anti-fuses in an IC die using electric current or a laser so that when the fuses or anti-fuses are accessed, they output a preprogrammed ID code. Unfortunately, none of these methods addresses the problem of identifying unrepairable IC dice "on" a manufacturing line.

SUMMARY OF THE INVENTION

The present invention provides a method in an integrated circuit (IC) manufacturing process for using data regarding manufacturing procedures IC's have undergone, such as repair procedures at probe, to select manufacturing procedures the IC's will undergo, such as additional repair procedures during back-end testing. The IC's are each programmed with a substantially unique identification (ID) code, such as a fuse ID.

The method includes storing data in association with the ID codes of the IC's that identifies manufacturing procedures the IC's have undergone. This data may identify spare circuitry already used to repair the IC's at probe, for example, or spare circuitry available to repair the IC's. The ID codes of the IC's are automatically read, for example, at an opens/shorts test during the manufacturing process. The data stored in association with the ID codes is then accessed, and manufacturing procedures the IC's will undergo, such as additional repair procedures during back-end testing, are selected in accordance with the accessed data. Thus, for example, the accessed data may indicate that insufficient spare circuitry is available on an IC to effect repairs, so the IC can proceed directly to a scrap bin without being "queried" to determine the availability of spare circuitry, as is traditionally necessary. The present invention thus eliminates the time-wasting conventional process of querying IC's prior to repair or scrapping.

Further embodiments include methods of manufacturing IC devices and MultiChip Modules (MCM's) which incorporate the method described above.

In an additional embodiment, a method in an MCM manufacturing process for diverting good but unrepairable IC dice from the process includes storing data in association with ID codes, such as fuse ID's, of the IC's that identifies IC's that are a) good and repairable, b) good but unrepairable, and c) bad. In the inventive method, the ID codes of the IC's are automatically read, and the data stored in association with the ID codes is accessed. IC's identified as good but unrepairable by the accessed data are diverted to other IC manufacturing processes, while IC's identified as bad are discarded, and IC's identified as good and repairable are assembled into MCM's.

The present invention thus prevents IC's that are unrepairable from being assembled into MCM's, such as Single In-Line Memory Modules (SIMM's), and thus prevents the reworking or scrapping of MCM's into which unrepairable IC's have been assembled.

DETAILED DESCRIPTION OF THE INVENTION

Figure 1:
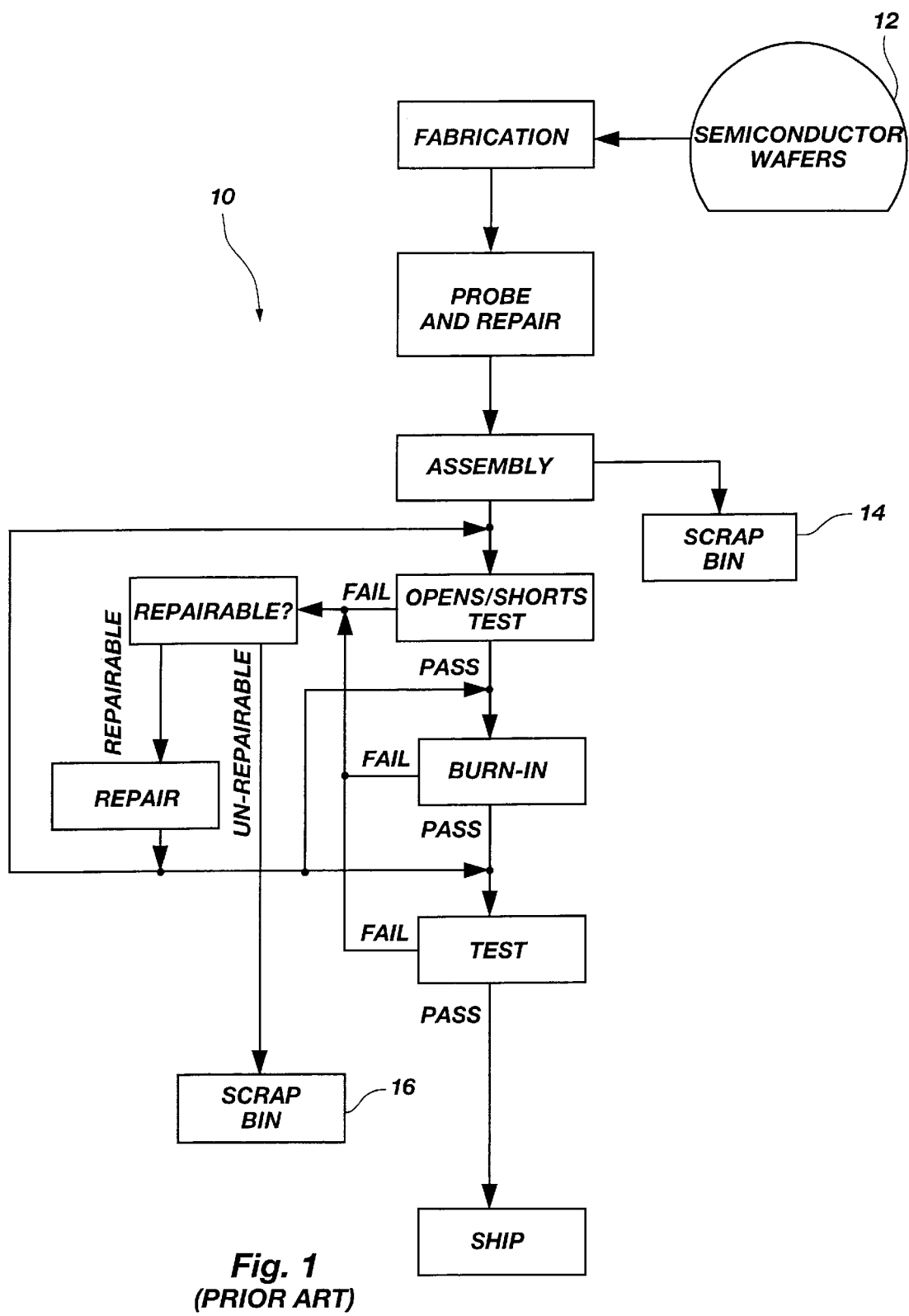
FIG. 1 is a flow diagram illustrating a conventional integrated circuit (IC) device manufacturing process.
Figure 2:
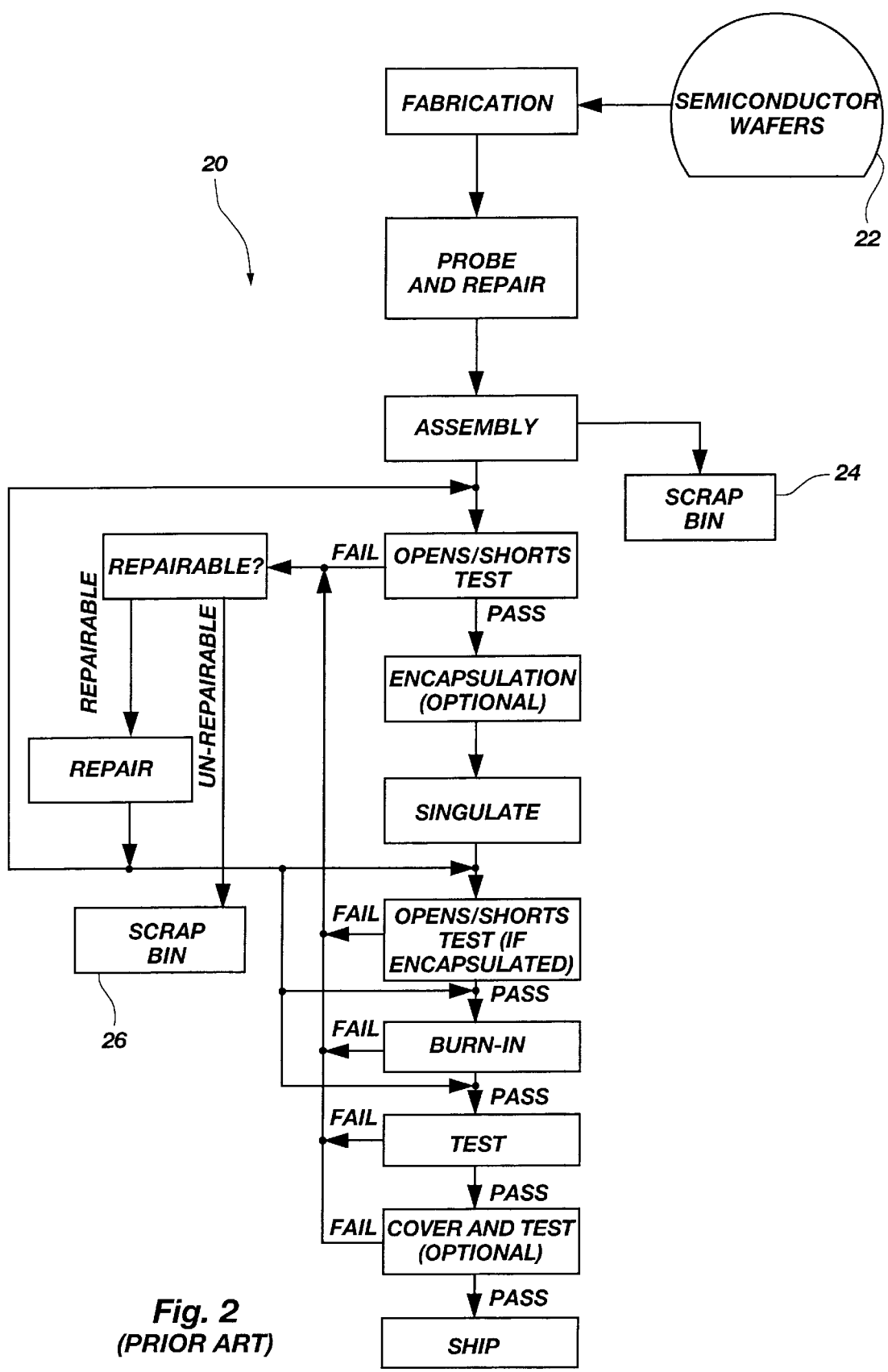
FIG. 2 is a flow diagram illustrating a conventional Chip-On-Board (COB) or flip-chip attached IC manufacturing process.
Figure 3A:
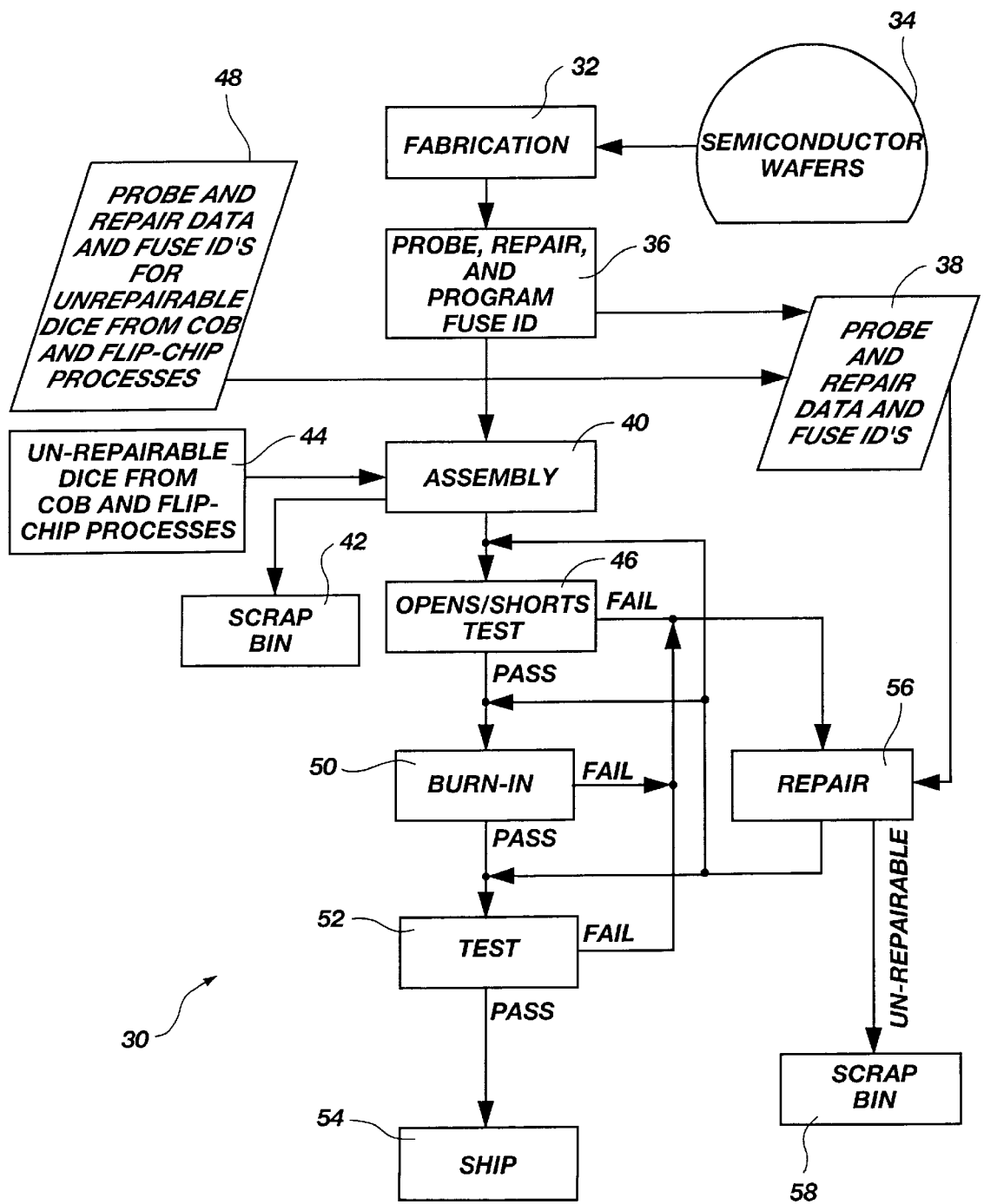
FIG. 3A is a flow diagram illustrating an IC device manufacturing process in accordance with the present invention.

As shown in FIG. 3A, an inventive process 30 for manufacturing Dynamic Random Access Memory (DRAM) Integrated Circuit (IC) devices begins with DRAM IC's being fabricated in a fabrication step 32 on the surface of a semiconductor wafer 34. It will be understood by those having skill in the field of this invention that the present invention is applicable to any IC devices, including Static Random Access Memory (SRAM) IC's, Synchronous DRAM (SDRAM) IC's, processor IC's, Single In-line Memory Modules (SIMM's), Dual In-line Memory Modules (DIMM's), and other Multi-Chip Modules (MCM's). It will also be understood that although the present invention will be described below in the context of a wire bond/lead frame assembly process, the present invention is applicable to any IC assembly process, including, for example, Chip On Board (COB) and flip-chip processes (as will be described below with respect to FIGS. 4A and 4B), and Tape-Automated Bonding (TAB) processes.

Once fabricated, the DRAM IC's are electronically probed in a probe step 36 to determine whether they are good or bad, and if any DRAM IC's are found to be bad, an attempt is made to repair those IC's by replacing nonfunctional rows or columns in the IC's with spare rows or columns. The location of bad DRAM IC's on a wafer 34, along with the location of any good DRAM IC's on the wafer 34, is stored in a computer in an electronic wafer map in association with data identifying spare rows and columns still available in each of the DRAM IC's after any repairs performed at the probe step 36. Of course, it will be understood that the stored data may alternatively identify spare rows and columns used in each of the DRAM IC's to effect repairs at the probe step 36.

During the probe step 36, DRAM IC's fabricated on the wafers 34 are programmed in the manner described above with a fuse identification (ID) unique to each IC. The fuse ID for each DRAM IC is then stored in association with the repair data 38 for that IC. The fuse ID may identify, for example, a wafer lot ID, the week the DRAM IC's were fabricated, a wafer ID, a die location on the wafer, and a fabrication facility ID. As a result of storing the fuse ID for each DRAM IC in association with the repair data 38, the availability of spare rows or columns for effecting post-probe repairs in a particular DRAM IC can be determined by using the fuse ID of the IC to access the stored repair data 38 for the IC, as will be described in more detail below.

It will be understood, of course, that the present invention includes within its scope DRAM and other IC's having any ID code, including those having fuse ID's. It will also be understood that the IC's may be programmed with their fuse ID's at steps in the manufacturing process 30 other than the probe step 36.

After being probed and, if necessary, repaired, DRAM IC's enter an assembly process 40 in which good IC's are assembled into IC devices, as will be described in more detail below with respect to FIG. 3B, while bad IC's are discarded in a scrap bin 42. In addition, DRAM IC's 44 that have been diverted from COB and flip-chip manufacturing process flows enter the assembly process 40 and are also assembled into IC devices. The DRAM IC's 44 are diverted from the COB and flip-chip process flows because so many of their spare rows and columns have been used at probe to effect repairs in the IC's 44 that the IC's 44 fall below a minimum threshold level of repairability, as will be described in more detail below with respect to FIGS. 4A and 4B.

After the assembly process 40, discrete DRAM IC devices are tested in an opens/shorts test 46. There, the fuse ID of the DRAM IC in each IC device is automatically read and correlated with the repair data 38 produced in the manufacturing process 30 or repair data 48 produced in a COB or flip-chip process flow as described below. It should be understood that although the fuse ID's of DRAM IC's in the process 30 are typically read electronically, they may also be read optically if the fuse ID's consist of "blown" laser fuses that are optically accessible. It should also be understood that the fuse ID's of DRAM IC's may be read at steps in the process 30 other than the opens/shorts test 46.

DRAM IC devices that pass the opens/shorts test 46 proceed on through the process 30 to various burn-in and test procedures 50 and 52 where they are tested for functionality, operability, and reliability, and DRAM IC devices that pass these burn-in and test procedures 50 and 52 are shipped 54 to customers.

DRAM IC devices that fail any of the opens/shorts, burn-in, and test procedures 46, 50, and 52 proceed to repair 56. Those DRAM IC devices that do not have enough available spare rows and columns to effect repairs, and thus are unrepairable, are identified as such when their repair data 38 and 48 is accessed at the opens/shorts test 46, and these devices proceed directly to rework or a scrap bin 58 without the need to query them. Of course, DRAM IC devices that are identified by their repair data 38 and 48 as being repairable are repaired, typically by replacing nonfunctional rows and columns with spare rows and columns in the same manner as described above. After being repaired, these DRAM IC devices then reenter the manufacturing process 30 just prior to the opens/shorts, burn-in, or test procedures 46, 50, and 52 they failed.

It should be understood, of course, that the present invention is applicable to situations in a wide variety of IC manufacturing processes in which data regarding manufacturing procedures the IC's have undergone, such as repair procedures at probe, may be accessed through the use of fuse ID's and other ID codes to determine procedures the IC's should undergo, such as post-probe repairs.

Figure 3B:
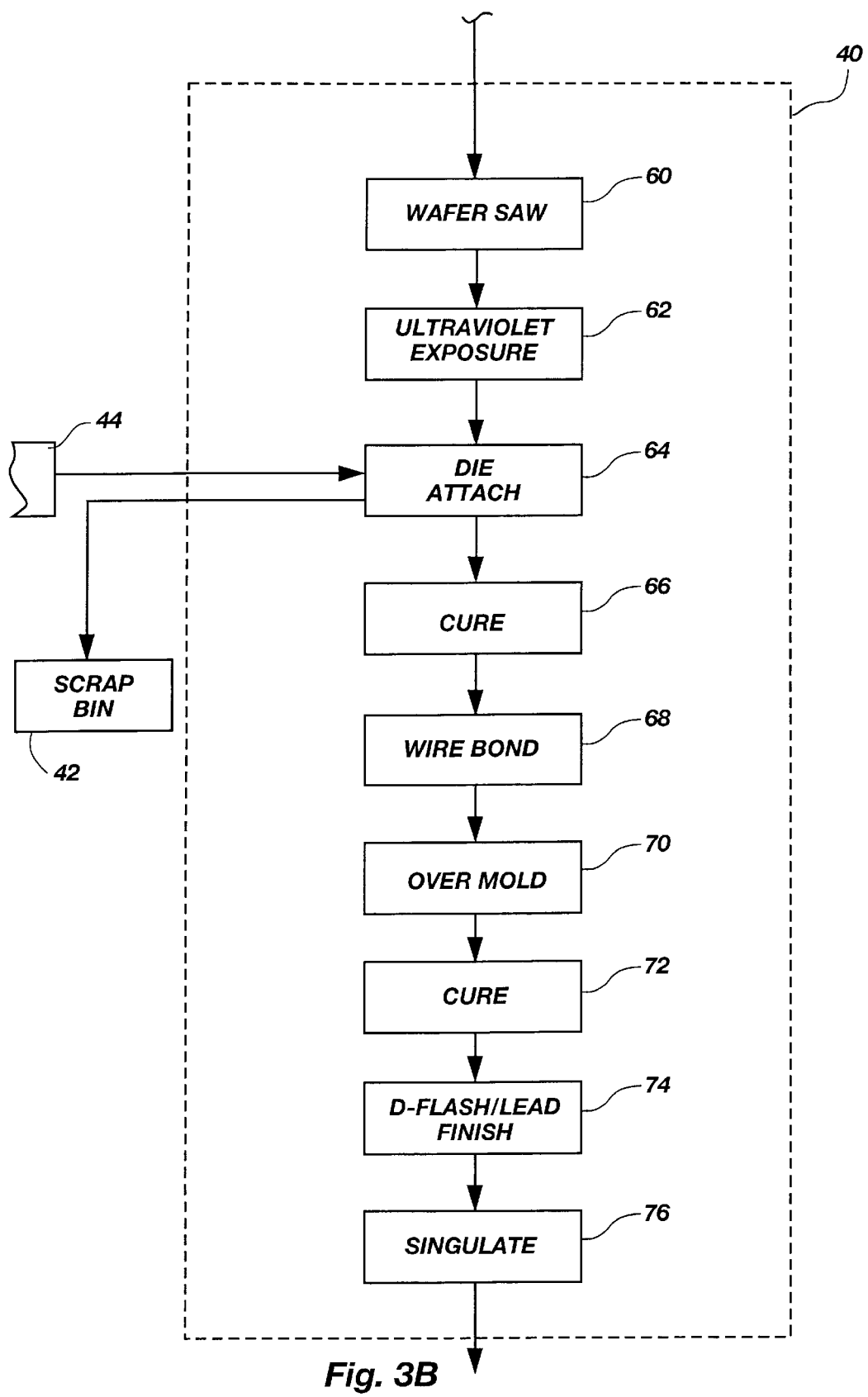
FIG. 3B is a flow diagram illustrating an assembly portion of the manufacturing process of FIG. 3A in more detail.

As stated above, the assembly process 40 of FIG. 3A is shown in more detail in FIG. 3B. In the process 40, probed and repaired semiconductor wafers enter a wafer saw step 60 and are mounted on an adhesive film. The film may be any one of a wide variety of adhesive films used for this purpose, including, for example, a special high-adhesion U.V. film. Without cutting the film, DRAM IC's are then sawed from their wafer into discrete IC dice using high-speed precision dicing equipment. DRAM IC dice that are mounted on the special high-adhesion U.V. film are then exposed to U.V. light in an optional U.V. exposure step 62 to loosen the grip of the film on the dice.

DRAM IC dice identified as good by their electronic wafer map are then each picked by automated equipment from their sawed wafer and its associated film in a die attach step 64 and placed on an epoxy coated bonding site of one lead frame in a strip of interconnected lead frames, while DRAM IC dice identified as bad are discarded into the scrap bin 42. In addition, DRAM IC dice 44 that have been diverted from COB and flip-chip manufacturing process flows enter the assembly process 40 and are also placed on an adhesive coated bonding site of one lead frame in a lead frame strip. These diverted DRAM IC's 44 will be described in more detail below with respect to FIGS. 4A and 4B.

The adhesive attaching the good DRAM IC dice to their lead frames is then cured, if required, in a cure step 66, and the attached dice are wire bonded to their lead frames using high speed bonding equipment in a wire bond step 68.

Once wire bonded, DRAM IC dice and their lead frames continue the assembly process 40 by being formed into DRAM IC packages using a hot thermosetting plastic encapsulant injected into a mold in an overmold step 70. DRAM IC packages are then cured in a further cure step 72 to set their plastic encapsulant. After encapsulation and curing, leads of the lead frames projecting from the packages may be dipped in a cleansing chemical bath in a de-flash process 74 and then may be electroplated with a lead/tin finish if they are not already plated. Finally, connections between the lead frames of different DRAM IC packages are then cut in a singulate step 76 to separate the packages into discrete DRAM IC devices.

Figure 4A:
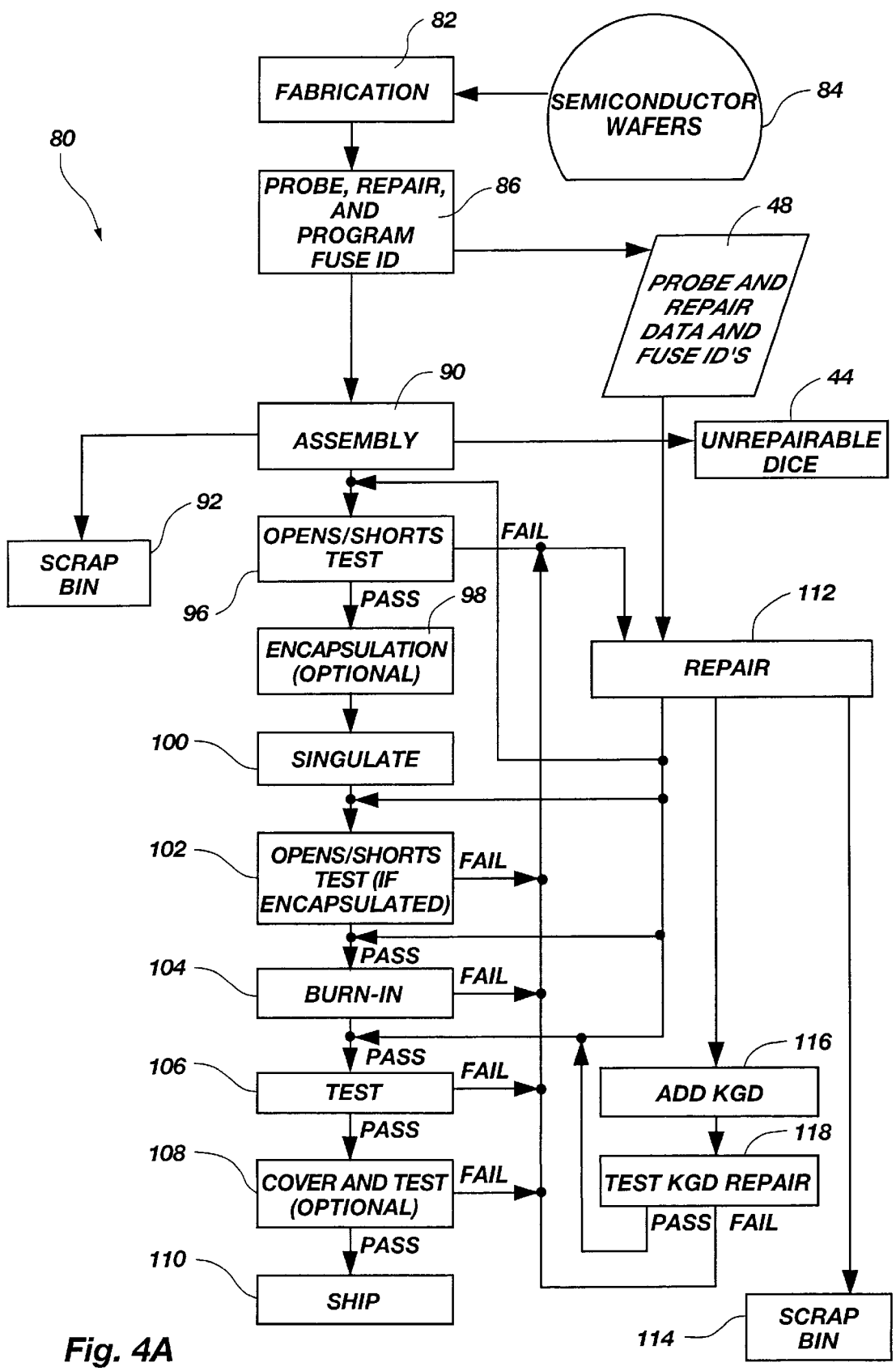
FIG. 4A is a flow diagram illustrating a COB or flip-chip multi-chip module IC manufacturing process in accordance with the present invention.

In another embodiment of the present invention shown in FIG. 4A, an inventive COB or flip-chip process 80 for manufacturing DRAM SIMM's begins with DRAM IC's being fabricated in a fabrication step 82 on the surface of a semiconductor wafer 84. It will be understood by those having skill in the field of this invention that the present invention is applicable to any IC devices, including SRAM IC's, SDRAM IC's, processor IC's, DIMM's, and other MCM's. It will also be understood that although the present invention will be described below in the context of both a COB and a flip-chip assembly process, the present invention is applicable to any IC assembly process, including, for example, Tape-Automated Bonding (TAB) processes.

Once fabricated, the DRAM IC's are electronically probed in a probe step 86 to determine whether they are good or bad, and if any DRAM IC's are found to be bad, an attempt is made to repair the IC's by replacing nonfunctional rows or columns in the IC's with spare rows or columns. The locations of bad DRAM IC's on a wafer 84, along with the locations of any good DRAM IC's on the wafer 84, are stored in a computer in an electronic wafer map in association with data 48 identifying spare rows and columns still available in each of the DRAM IC's after any repairs performed at the probe step 86.

During the probe step 86, DRAM IC's fabricated on the wafers 84 are programmed in the manner described above with a fuse identification (OD) unique to each IC. The fuse ID for each DRAM IC is then stored in association with the repair data 48 for that IC. The fuse ID may identify, for example, a wafer lot ID, the week the DRAM IC's were fabricated, a wafer ID, a die location on the wafer, and a fabrication facility ID.

It will be understood, of course, that the present invention includes within its scope IC's having any ID code, including those having fuse ID's. It will also be understood that the IC's may be programmed with their fuse ID's at steps in the manufacturing process 80 other than the probe step 86.

After being probed and, if necessary, repaired, DRAM IC's enter an assembly process 90 in which good IC's are assembled into panels of physically interconnected DRAM SIMM's, as will be described in more detail below with respect to FIG. 4B, while bad IC's are discarded in a scrap bin 92. In addition, DRAM IC's 44 in which so many spare rows and columns have been used at the probe step 86 to effect repairs that the IC's 44 fall below a minimum threshold of repairability are diverted from the COB or flip-chip process 80 for use in the standard assembly process 40 of FIGS. 3A and 3B. Although a "minimum threshold of repairability" can be set at any level, it might be set, for example, at a level at which statistically the available spare rows and columns in a DRAM IC would only be able to effect repairs in an unacceptably low percentage (e.g., 50%) of cases of failures. Thus, the diverted DRAM IC's 44 typically include those IC's that have exhausted their spare rows and columns in repairs at the probe step 86, and those IC's that have some, but not enough, spare rows and columns left after being repaired at the probe step 86.

The present invention thus prevents DRAM IC's that would be repairable in few or none of the possible cases of failure from being assembled into DRAM SIMM's and other MCM's, and thus prevents the waste of time and resources associated with scrapping or reworking MCM's into which such IC's have traditionally been assembled.

After the assembly process 90, panels of DRAM SIMM's are tested in an opens/shorts test 96. There, the fuse ID of each DRAM IC in each DRAM SIMM is automatically read and correlated with the repair data 48. It should be understood that although the fuse ID's of DRAM IC's in the process 80 are typically read electronically, they may also be read optically if the fuse ID's consist of "blown" laser fuses that are optically accessible. It should also be understood that the fuse ID's of DRAM IC's may be read at steps in the process 80 other than the opens/shorts test 96.

When the manufacturing process 80 is a COB process, panels of DRAM SIMM's having COB IC dice that pass the opens/shorts test 96 proceed to an encapsulation step 98 so the dice can be encapsulated using an overmold, hard cover, or glob top. Alternatively, when the manufacturing process 80 is a flip-chip process, panels of DRAM SIMM's having flip-chip IC dice that pass the opens/shorts test 96 may have their dice encapsulated at the encapsulation step 98 using an underfill followed by an overmold, hard cover, or glob top. As will be described in more detail below, alternatively, the flip-chip IC dice may be encapsulated after burn-in and test procedures. The disposition of panels of DRAM SIMM's having IC dice that fail the opens/shorts test will be described in more detail below.

Panels of DRAM SIMM's having either COB or flip-chip IC dice, including those panels of SIMM's having flip-chip IC dice that were not encapsulated at the encapsulation step 98, are then singulated into discrete DRAM SIMM's at a singulation step 100 by, for example, a water jet or a shear press. This singulation step 100 may, for example, divide a "ten" panel of ten physically attached DRAM SIMM's into ten discrete DRAM SIMM's.

After singulation, DRAM SIMM's having encapsulated IC dice are tested again in an additional opens/shorts test 102 to check for problems caused by the encapsulation step 98. DRAM SIMM's having encapsulated dice that pass this additional opens/shorts test 102, as well as DRAM SIMM's having dice that were not encapsulated, then proceed on in the manufacturing process 80 to burn-in testing 104 and back-end testing 106. The disposition of those DRAM SIMM's having encapsulated IC dice that fail the additional opens/shorts test 102 will be described in more detail below. The fuse ID's of the IC dice in the DRAM SIMM's may also be automatically read at this additional opens/shorts test 102.

After the burn-in and test procedures 104 and 106, DRAM SIMM's having un-encapsulated flip-chip IC dice that pass the procedures 104 and 106 proceed on in the process 80 to an optional cover step 108 so their dice may be covered with an overmold, hardcover, or glob top. Dice covered in this manner are then checked in a further opens/shorts test 108 for problems caused by their being covered, and DRAM SIMM's having dice that pass this further test are then typically shipped in a shipping step 110 to customers. DRAM SIMM's having encapsulated IC dice that pass the burn-in and test procedures 104 and 106 skip this covering and final opens/shorts test step 108 and proceed to the shipping step 110. Of course, the fuse ID's of the IC dice in the DRAM SIMM's tested at any of the burn-in, back-end test, and opens/shorts test procedures 104, 106, and 108 may be automatically read at any one or all of those tests.

DRAM SIMM's having IC dice that fail any of the opens/shorts, burn-in, and test procedures 96, 102, 104, 106 and 108 proceed to repair 112. Those DRAM SIMM's having DRAM IC dice that do not have enough available spare rows and columns to effect repairs, and thus are unrepairable, are identified as such when their repair data 48 is accessed at any one of the opens/shorts, burn-in, and back-end tests 96, 102, 104, 106, and 108, and these SIMM's proceed directly to rework (described below) or a scrap bin 114 without the need to query them. Of course, DRAM SIMM's having DRAM IC dice identified by their repair data 48 as being repairable are repaired, typically by replacing nonfunctional rows and columns with spare rows and columns in the same manner as described above. After being repaired, these DRAM SIMM's then reenter the manufacturing process 80 just prior to the opens/shorts, burn-in, or test procedures 96, 102, 104, 106 or 108 they failed.

Those DRAM SIMM's that are reworkable by replacing one or more non-functioning IC dice proceed through a Known Good Die (KGD) process in which a DRAM KGD (i.e., a burned-in, fully tested, fully functional DRAM) replaces the non-functioning IC dice on the SIMM's in a replacement step 116. The KGD repairs are then tested in a repair step 118, and if the repairs are successful, the repaired DRAM SIMM's reenter the manufacturing process 80 just prior to the back-end test procedures 106. If the repairs are not successful, the DRAM SIMM's may return to the repair step 112 to be reworked again or, if they are not reworkable, to be scrapped in the scrap bin 114.

Figure 4B:
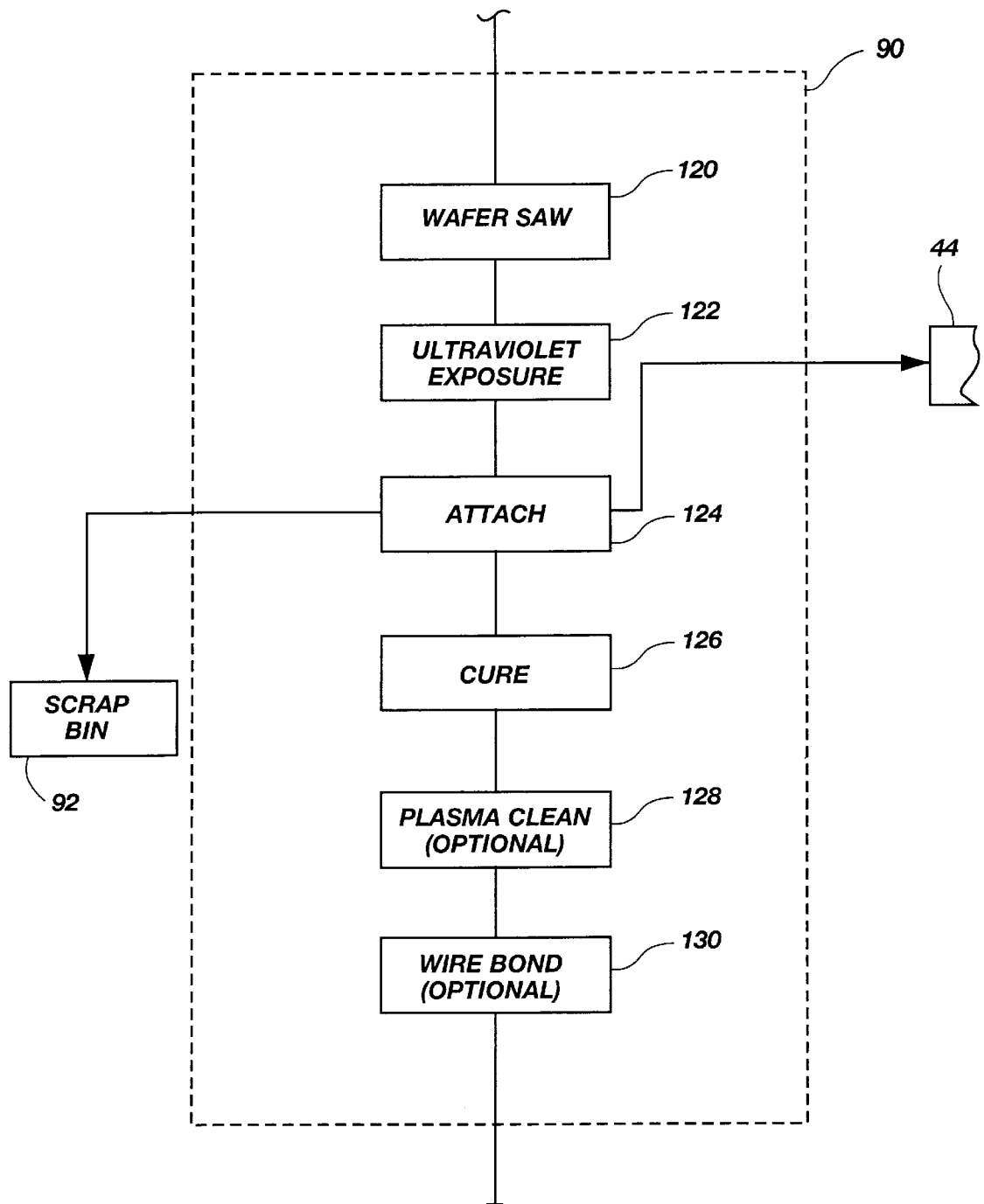
FIG. 4B is a flow diagram illustrating an assembly portion of the manufacturing process of FIG. 4A in more detail.

As stated above, the assembly process 90 of FIG. 4A is shown in more detail in FIG. 4B. In the process 90, probed and repaired semiconductor wafers enter a wafer saw step 120 and are mounted on an adhesive film. The film may be any one of a wide variety of adhesive films used for this purpose, including, for example, a special high-adhesion U.V. film. Without cutting the film, DRAM IC's are then sawed from their wafer into discrete DRAM IC dice using high-speed precision dicing equipment. DRAM IC dice that are mounted on the special high-adhesion U.V. film are then exposed to U.V. light in an optional U.V. exposure step 122 to loosen the grip of the film on the dice.

IC dice identified as good by their electronic wafer map are then each picked by automated equipment from their sawed wafer and its associated film at an attachment step 124. If the assembly process 90 is a flip-chip process, multiple picked dice are then flipped and directly attached at their active, frontside surfaces to a panel of PCB's or other substrates to form, for example, DRAM SIMM's. If the assembly process 90 is a COB process, multiple picked dice are directly attached at their inactive, backside surface to an adhesive coated bonding site of a panel of PCB's or other substrates to form, for example, DRAM SIMM's. DRAM IC dice identified as bad are discarded into the scrap bin 92, while DRAM IC dice 44 that have used so many of their spare rows and columns in repairs at the probe step 86 that they fall below the minimum threshold of repairability are diverted to the standard assembly process 40 of FIGS. 3A and 3B. Panels of DRAM SIMM's are then cured at a cure step 126. If the assembly process 90 is a COB process, the panels may be plasma cleaned in an optional plasma cleaning step 128, if necessary, and the COB IC dice are then wire bonded at a wire bond step 130 to their DRAM SIMM's using high speed bonding equipment. DRAM SIMM's then proceed to the opens/shorts test 96 described above with respect to FIG. 4A.

Although the present invention has been described with reference to particular embodiments, the invention is not limited to these embodiments. For example, while the various steps of these embodiments have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. An integrated circuit (IC) manufacturing process using data regarding manufacturing procedures a plurality of IC's have undergone to select manufacturing procedures the IC's will undergo, the IC's being of the type to have a substantially unique identification (ID) code, the process comprising:

providing IC's comprising Dynamic Random Access Memory (DRAM) IC's;

storing data in association with the ID code of each of the IC's that identifies manufacturing procedures the IC's have undergone, said storing data including storing data for identifying repairs performed on the IC's and storing data that identifies spare rows and columns available to effect repairs in the DRAM IC's;

automatically reading the ID code of each of the IC's;

accessing the data stored in association with the ID code of each of the IC's; and selecting manufacturing procedures the IC's undergo in accordance with the accessed data; and assembling the IC's into packaged IC devices after the step of storing data and before the step of automatically reading the ID code of each of the IC's.

2. The process of claim 1, wherein the IC's comprise Dynamic Random Access Memory (DRAM) IC's and wherein the storing data comprises storing data that identifies spare rows and columns used in repairing the DRAM IC's.

3. The process of claim 1, wherein the step of storing data comprises storing data at probe.

4. The process of claim 1, wherein the step of automatically reading the ID code of each of the IC's comprises electrically retrieving a unique fuse ID programmed into each of the IC's.

5. The process of claim 1, wherein the step of automatically reading the ID code of each of the IC's comprises optically reading a unique ID code provided on each of the IC's.

6. The process of claim 5, wherein the step of optically reading a unique ID code provided on each of the IC's comprises optically reading a unique laser fuse ID programmed into each of the IC's.

7. The process of claim 1, wherein the step of automatically reading the ID code of each of the IC's comprises automatically reading the ID code of each of the IC's at one of an opens/shorts test, a burn-in test, and a back-end test in the IC manufacturing process.

8. The process of claim 1, wherein the step of accessing the data stored in association with the ID code of each of the IC's comprises accessing the data stored in association with the ID code of each of the IC's at one of an opens/shorts test, a burn-in test, and a back-end test in the IC manufacturing process.

9. The process of claim 1, wherein the step of selecting manufacturing procedures the IC's will undergo in accordance with the accessed data comprises selecting repairs the IC's will undergo in accordance with the accessed data.

10. The process of claim 9, wherein the IC's comprise Dynamic Random Access Memory (DRAM) IC's, wherein the step of selecting repairs the IC's will undergo comprises selecting spare rows and columns that will be used to repair the DRAM IC's.

11. The process of claim 1, wherein selecting manufacturing procedures the IC's will undergo in accordance with the accessed data comprises selecting whether the IC's will undergo repair procedures.

12. The process of claim 11, wherein the IC's comprise Dynamic Random Access Memory (DRAM) IC's, wherein the step of selecting whether the IC's will undergo repair procedures comprises selecting whether the DRAM IC's will be repaired in accordance with whether the accessed data indicates enough spare rows and columns are available in the IC's to effect repairs.

13. The process of claim 1, wherein the step of selecting manufacturing procedures the IC's will undergo in accordance with the accessed data comprises determining whether the IC's will be assembled into Multi-Chip Modules (MCM's) in accordance with whether the accessed data indicates the IC's are repairable.

14. The process of claim 1, further comprising assembling the IC's into packaged IC devices after the step of storing data and before the step of automatically reading the ID code of each of the IC's.

15. A method of manufacturing integrated circuit (IC) devices from semiconductor wafers, the method comprising:

providing a plurality of semiconductor wafers;

fabricating a plurality of IC's on each of the wafers;

causing each of the IC's on each of the wafers to store a substantially unique identification (ID) code;

storing data in association with the ID code of each of the IC's that identifies manufacturing procedures the IC's have undergone;

separating each of the IC's on each of the wafers from its wafer to form one of a plurality of IC dice;

assembling each of the IC dice into an IC device, said assembling including:

picking each of the IC dice from its wafer;

placing each of the IC dice onto an epoxy coated bonding site of one of a plurality of lead frames;

curing the epoxy on the bonding site of each of the lead frames;

wire bonding each of the IC dice to its associated lead frame;

encapsulating each of the IC dice and its associated lead frame to form one of a plurality of IC packages each having projecting leads;

curing each of the IC packages;

de-flashing the projecting leads of each of the IC packages;

electroplating the projecting leads of each of the IC packages; and singulating each of the IC packages into one of a plurality of discrete IC devices; automatically reading the ID code associated with each of the IC devices; and accessing the data stored in association with the ID code associated with each of the IC devices.

16. The method of claim 15, further comprising: selecting manufacturing procedures the IC's will undergo in accordance with the accessed data.

17. The method of claim 15, wherein the step of fabricating a plurality of IC's on each of the wafers comprises fabricating IC's selected from a group comprising Dynamic Random Access Memory (DRAM) IC's, Static Random Access Memory (SRAM) IC's, Synchronous DRAM (SDRAM) IC's, and processor IC's.

18. The method of claim 15, wherein the step of causing each of the IC's on each of the wafers to store a substantially unique ID code comprises programming each of the IC's on each of the wafers to permanently store a unique fuse ID.

19. The method of claim 15, wherein the step of programming each of the IC's on each of the wafers to permanently store a unique fuse ID comprises programming at least one of fuses and anti-fuses in each of the IC's on each of the wafers to permanently store a unique fuse ID.

20. The method of claim 15, wherein the step of assembling each of the IC dice into an IC device comprises assembling each of the IC dice into an IC device selected from a group comprising a wire bond/lead frame IC device, a Chip-On-Board (COB) IC device, and a flip-chip IC device.

21. A method of manufacturing Multi-Chip Modules (MCM's) from semiconductor wafers, the method comprising:

providing a plurality of semiconductor wafers;

fabricating a plurality of semiconductor devices on each of the wafers, each semiconductor device comprising a Dynamic Random Access Memory;

causing each of the semiconductor devices on each of the wafers to store a substantially unique identification (ID) code;

storing data in association with the ID code of each of the semiconductor devices that identifies manufacturing procedures the semiconductor devices have undergone, said storing data including storing data for identifying repairs performed on the semiconductor device and storing data that identifies spare rows and columns available to effect repairs in the semiconductor device;

separating each of the semiconductor devices on each of the wafers from its wafer to form one of a plurality of semiconductor devices;

assembling one or more of the semiconductor devices into each of a plurality of MCM's;

automatically reading the ID code of each of the semiconductor devices in each of the MCM's; and accessing the data stored in association with the ID code of each of the semiconductor devices in each of the MCM's.

22. The method of claim 21, further comprising:

selecting manufacturing procedures the semiconductor devices will undergo in accordance with the accessed data.

23. The method of claim 21, wherein the MCM's are selected from a group comprising Single In-Line Memory Modules (SIMM's) and Dual In-line Memory Modules (DIMM's).

24. A method of manufacturing semiconductor devices from semiconductor wafers, the method comprising:

providing a plurality of semiconductor wafers;

fabricating a plurality of semiconductor devices on each of the wafers;

electronically probing each of the semiconductor devices on each of the wafers to identify good, bad and repairable semiconductor devices on each of the wafers;

repairing the repairable semiconductor devices;

programming each of the semiconductor devices on each of the wafers to store a unique fuse identification;

storing data in association with the fuse identification of each of the semiconductor devices identifying repairs performed on each of the semiconductor devices;

mounting each of the wafers on an adhesive film;

sawing each of the semiconductor devices on each of the wafers from its wafer to form one of a plurality of discrete devices;

automatically picking each of the semiconductor devices from its wafer;

placing each of the semiconductor devices onto an epoxy coated bonding site of one of a plurality of lead frames;

curing the epoxy on the bonding site of each of the lead frames;

wire bonding each of the semiconductor devices to its associated lead frame;

encapsulating each of the semiconductor devices and its associated lead frame to form one of a plurality of semiconductor device packages each having projecting leads;

curing each of the semiconductor device packages;

de-flashing the projecting leads of each of the semiconductor device packages;

electroplating the projecting leads of each of the semiconductor device packages;

singulating each of the semiconductor device packages into one of a plurality of discrete semiconductor devices;

testing each of the semiconductor devices for opens and shorts;

burn-in testing each of the semiconductor devices;

back-end testing each of the semiconductor devices;

automatically reading the identification code of each of the semiconductor devices;

accessing the data stored in association with the identification code of each of the semiconductor devices;

for any semiconductor devices failing any one of the opens/shorts, burn-in, and back-end tests, evaluating the accessed data to determine whether the failing semiconductor devices may be repaired;

repairing any of the semiconductor devices determined in accordance with the accessed data to be repairable and returning the repaired semiconductor devices to the semiconductor manufacturing process; and discarding any of the semiconductor devices determined in accordance with the accessed data to be unrepairable.

25. The method of claim 24, wherein the step of mounting the wafers comprises mounting each of the wafers on an ultraviolet (U.V.) adhesive film, wherein the method further comprises exposing the U.V. adhesive film to U.V. light to loosen the wafers from the film prior to picking and placing the IC dice.

26. The method of claim 24, further comprising receiving a plurality of unrepairable IC dice diverted from another IC manufacturing process for assembly into IC devices.

27. A method of manufacturing Multi-Chip Modules (MCM's) from semiconductor wafers using Chip-On-Board (COB) techniques, the method comprising:

providing a plurality of semiconductor wafers;

fabricating a plurality of semiconductor devices on each of the wafers;

electronically probing each of the semiconductor devices on each of the wafers to identify good, bad and repairable semiconductor devices on each of the wafers;

repairing the repairable semiconductor devices;

programming each of the semiconductor devices on each of the wafers to store a unique fuse identification (ID);

storing an electronic wafer map for each wafer that identifies the locations of good and bad semiconductor devices on the wafer and associates each IC on the wafer with its fuse ID;

storing data in association with the fuse ID of each of the semiconductor devices identifying repairs performed on each of the semiconductor devices;

mounting each of the wafers on an adhesive film;

sawing each of the semiconductor devices on each of the wafers from its wafer to form one of a plurality of discrete semiconductor dice;

accessing the stored wafer map for each wafer;

accessing the stored data for each of the semiconductor devices on each of the wafers;

automatically picking each of the good semiconductor devices from its wafer;

discarding non-picked semiconductor devices identified as bad by the accessed wafer maps;

diverting picked semiconductor devices identified as good but unrepairable by the accessed wafer maps and data to a non-MCM semiconductor manufacturing process;

placing picked semiconductor devices identified as good and repairable by the accessed wafer maps and data onto epoxy coated bonding sites of each of a plurality of printed circuit boards using COB techniques to form a plurality of MCM's;

curing the epoxy on the bonding sites of each of the MCM's;

wire bonding each of the semiconductor devices to its associated MCM;

testing each of the semiconductor devices on each of the MCM's for opens and shorts;

encapsulating each of the semiconductor devices on each of the MCM's;

retesting each of the semiconductor devices on each of the MCM's for opens and shorts;

burn-in testing each of the semiconductor devices on each of the MCM's;

back-end testing each of the semiconductor devices on each of the MCM's;

automatically reading the ID code of each of the IC dice in each of the MCM's;

accessing the data stored in association with the ID code of each of the semiconductor devices;

for any semiconductor devices failing any one of the opens/shorts, burn-in, and back-end tests, evaluating the accessed data to determine whether the failing IC dice may be repaired;

repairing any of the semiconductor devices determined in accordance with the accessed data to be repairable and returning the repaired MCM's to the manufacturing process; and replacing any of the semiconductor devices determined in accordance with the accessed data to be unrepairable with Known Good Die (KGD) dice and returning the repaired MCM's to the manufacturing process.

28. The method of claim 27, further comprising plasma cleaning each of the MCM's after curing the epoxy on the bonding sites of the MCM's.

29. The method of claim 27, wherein the step of mounting the wafers comprises mounting each of the wafers on an Ultraviolet (U.V.) adhesive film, wherein the method further comprises exposing the U.V. adhesive film to U.V. light to loosen the wafers from the film prior to picking and placing the IC dice.

30. The method of claim 27, further comprising singulating the printed circuit boards associated with each of the MCM's to form discrete MCM's.

31. A method of manufacturing Multi-Chip Modules (MCM's) from semiconductor wafers using flip-chip techniques, the method comprising:

providing a plurality of semiconductor wafers;

fabricating a plurality of devices on each of the wafers;

electronically probing each of the devices on each of the wafers to identify good, bad and repairable devices on each of the wafers;

repairing the repairable devices;

programming each of the devices on each of the wafers to store a unique fuse identification (ID);

storing an electronic wafer map for each wafer that identifies the locations of good and bad devices on the wafer and associates each device on the wafer with its fuse ID;

storing data in association with the fuse ID of each of the devices identifying repairs performed on each of the devices;

mounting each of the wafers on an adhesive film;

sawing each of the devices on each of the wafers from its wafer to form one of a plurality of discrete devices;

accessing the stored wafer map for each wafer;

accessing the stored data for each of the devices on each of the wafers;

automatically picking each of the good devices from its wafer;

discarding non-picked devices identified as bad by the accessed wafer maps;

diverting picked devices identified as good but unrepairable by the accessed wafer maps and data to a non-MCM device manufacturing process;

flip-chip attaching picked devices identified as good and repairable by the accessed wafer maps and data to bonding sites of each of a plurality of printed circuit boards to form a plurality of MCM's;

curing each of the MCM's;

testing each of the devices on each of the MCM's for opens and shorts;

encapsulating each of the devices on each of the MCM's;

retesting each of the devices on each of the MCM's for opens and shorts;

burn-in testing each of the devices on each of the MCM's;

back-end testing each of the devices on each of the MCM's;

automatically reading the ID code of each of the devices in each of the MCM's;

accessing the data stored in association with the ID code of each of the devices;

for any devices failing any one of the opens/shorts, burn-in, and back-end tests, evaluating the accessed data to determine whether the failing devices may be repaired;

repairing any of the devices determined in accordance with the accessed data to be repairable and returning the repaired MCM's to the manufacturing process; and replacing any of the devices determined in accordance with the accessed data to be unrepairable with Known Good Die (KGD) dice and returning the repaired MCM's to the manufacturing process.

32. The method of claim 31, wherein the step of mounting the wafers comprises mounting each of the wafers on an Ultraviolet (U.V.) adhesive film, wherein the method further comprises exposing the U.V. adhesive film to U.V. light to loosen the wafers from the film prior to picking and flip-chip attaching the IC dice.

33. The method of claim 31, further comprising singulating the printed circuit boards associated with each of the MCM's to form discrete MCM's.

34. A method in an integrated circuit (IC) Multi-Chip Module (MCM) manufacturing process for diverting good but unrepairable semiconductor devices from the process, the semiconductor devices being of the type to have a substantially unique identification (ID) code, the method comprising:

storing data in association with the ID code of each of the semiconductor devices that identifies semiconductor devices that are good and repairable, that are good but unrepairable, and that are bad;

automatically reading the ID code of each of the semiconductor devices;

accessing the data stored in association with the ID code of each of the semiconductor devices;

diverting semiconductor devices identified as good but unrepairable by the accessed data to other semiconductor device manufacturing processes; and discarding semiconductor devices identified as bad by the accessed data.

35. The method of claim 34, further comprising:

assembling semiconductor devices identified as good and repairable into MCM's.

* * * * *

UNITED STATES PATENT AND TRADEMARK OFFICE
CERTIFICATE OF CORRECTION

| | | |
|---|---|---|
| PATENT NO. | : 6,363,295 B1 | Page 1 of 1 |
| APPLICATION NO. | : 09/292655 | |
| DATED | : March 26, 2002 | |
| INVENTOR(S) | : Salman Akram et al. | |

It is certified that error appears in the above-identified patent and that said Letters Patent is hereby corrected as shown below:

On the title page:
In item (56) References Cited, LINE 4, change "Jean" to --Jeon--

In the specification:
      COLUMN 1, LINE 20, change "08/85,353" to --08/785,353--
      COLUMN 1, LINE 23, change "6" to --26--
      COLUMN 4, LINE 66, change "MultiChip" to --Multi-Chip--
      COLUMN 8, LINE 14, change "(OD)" to --(ID)--

In the claims:
CLAIM 21, COLUMN 13, LINE 12, before "semiconductor" change "the" to --each--
CLAIM 21, COLUMN 13, LINE 14, before "semiconductor" change "the" to --each plurality of--
CLAIM 27, COLUMN 14, LINE 49, change "IC" to --semiconductor device--
CLAIM 27, COLUMN 15, LINE 23, change "IC" to --plurality of semiconductor--
CLAIM 29, COLUMN 47, LINE 47, change "IC" to --plurality of semiconductor--
CLAIM 31, COLUMN 15, LINE 63, at the end of the line, change "the" to --each--
CLAIM 31, COLUMN 15, LINE 64, before "wafer" change "the" to --each--

Signed and Sealed this
Nineteenth Day of August, 2014

Michelle K. Lee
*Deputy Director of the United States Patent and Trademark Office*

UNITED STATES PATENT AND TRADEMARK OFFICE
CERTIFICATE OF CORRECTION

Page 1 of 1

PATENT NO. : 6,363,295 B1
APPLICATION NO. : 09/292655
DATED : March 26, 2002
INVENTOR(S) : Salman Akram et al.

It is certified that error appears in the above-identified patent and that said Letters Patent is hereby corrected as shown below:

On the title page:
In item (56) References Cited, LINE 4, change "Jean" to --Jeon--

In the specification:
| | | |
|---|---|---|
| COLUMN 1, | LINE 20, | change "08/85,353" to --08/785,353-- |
| COLUMN 1, | LINE 23, | change "6" to --26-- |
| COLUMN 4, | LINE 66, | change "MultiChip" to --Multi-Chip-- |
| COLUMN 8, | LINE 14, | change "(OD)" to --(ID)-- |

In the claims:
| | |
|---|---|
| CLAIM 21, COLUMN 13, LINE 12, | before "semiconductor" change "the" to --each-- |
| CLAIM 21, COLUMN 13, LINE 14, | before "semiconductor" change "the" to --each plurality of-- |
| CLAIM 27, COLUMN 14, LINE 49, | change "IC" to --semiconductor device-- |
| CLAIM 27, COLUMN 15, LINE 23, | change "IC" to --plurality of semiconductor-- |
| CLAIM 29, COLUMN 15, LINE 47, | change "IC" to --plurality of semiconductor-- |
| CLAIM 31, COLUMN 15, LINE 63, | at the end of the line, change "the" to --each-- |
| CLAIM 31, COLUMN 15, LINE 64, | before "wafer" change "the" to --each-- |

This certificate supersedes the Certificate of Correction issued August 19, 2014.

Signed and Sealed this
Ninth Day of September, 2014

Michelle K. Lee
*Deputy Director of the United States Patent and Trademark Office*